United States Patent
Sethuraman et al.

(10) Patent No.: US 6,849,946 B2
(45) Date of Patent: Feb. 1, 2005

(54) PLANARIZED SEMICONDUCTOR INTERCONNECT TOPOGRAPHY AND METHOD FOR POLISHING A METAL LAYER TO FORM INTERCONNECT

(75) Inventors: Anantha R. Sethuraman, Fremont, CA (US); Christopher A. Seams, Pleasanton, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 40 days.

(21) Appl. No.: 09/779,123

(22) Filed: Feb. 7, 2001

(65) Prior Publication Data

US 2002/0106886 A1 Aug. 8, 2002

Related U.S. Application Data

(63) Continuation of application No. 09/143,723, filed on Aug. 31, 1998, now Pat. No. 6,232,231.

(51) Int. Cl.$^7$ .............................................. H01L 23/48
(52) U.S. Cl. ...................... 257/752; 257/774; 257/775; 438/691; 438/692; 438/697; 438/700
(58) Field of Search ................................ 438/633, 691, 438/692, 697, 700, 618, 926; 257/752, 774, 775; 216/38, 88, 89; 156/636.1, 639.1, 645.1; 204/192.37, 192.35

(56) References Cited

U.S. PATENT DOCUMENTS

| | | |
|---|---|---|
| 3,629,023 A | 12/1971 | Strehlow |
| 3,979,239 A | 9/1976 | Walsh |
| 4,010,583 A | 3/1977 | Highberg .................... 51/284 |
| 4,193,226 A | 3/1980 | Gill, Jr. et al. ........... 51/124 R |
| 4,256,535 A | 3/1981 | Banks |
| 4,261,791 A | 4/1981 | Shwartzman |
| 4,373,991 A | 2/1983 | Banks |

(List continued on next page.)

FOREIGN PATENT DOCUMENTS

EP    0 303 061    2/1989

OTHER PUBLICATIONS

Malkoe et al., "Effect of Retaining Ring System on the Polishing of 300 mm Oxide–Wafers," Mar. 2001, pp. 519–522.

(List continued on next page.)

*Primary Examiner*—Hsien-Ming Lee
(74) *Attorney, Agent, or Firm*—Kevin L. Daffer; Mollie E. Lettang; Daffer McDaniel, LLP

(57) ABSTRACT

The present invention advantageously provides a substantially planarized semiconductor topography and method for making the same by forming a plurality of dummy features in a dielectric layer between a relatively wide interconnect and a series of relatively narrow interconnect. According to an embodiment, a plurality of laterally spaced dummy trenches are first etched in the dielectric layer between a relatively wide trench and a series of relatively narrow trenches. The dummy trenches, the wide trench, and the narrow trenches are filled with a conductive material, e.g., a metal. The conductive material is deposited to a level spaced above the upper surface of the dielectric layer. The surface of the conductive material is then polished to a level substantially coplanar with that of the upper surface of the dielectric layer. Advantageously, the polish rate of the conductive material above the dummy trenches and the wide and narrow trenches is substantially uniform. In this manner, dummy conductors spaced apart by dielectric protrusions are formed exclusively in the dummy trenches, and interconnect are formed exclusively in the narrow and wide trenches. The topological surface of the resulting interconnect level is substantially void of surface disparity.

22 Claims, 3 Drawing Sheets

U.S. PATENT DOCUMENTS

| | | |
|---|---|---|
| 4,393,628 A | 7/1983 | Ottman et al. ............... 51/281 |
| 4,505,720 A | 3/1985 | Gabor et al. |
| 4,600,469 A | 7/1986 | Fusco et al. |
| 4,677,043 A | 6/1987 | Cordes, III et al. |
| 4,768,883 A | 9/1988 | Waldo et al. |
| 4,778,532 A | 10/1988 | McConnell et al. |
| 4,789,648 A | 12/1988 | Chow et al. |
| 4,811,522 A | 3/1989 | Gill, Jr. .................... 51/131.1 |
| 4,879,258 A | 11/1989 | Fisher |
| 4,933,715 A | 6/1990 | Yamada et al. |
| 4,944,836 A | 7/1990 | Beyer et al. |
| 4,954,141 A | 9/1990 | Takiyama et al. |
| 4,956,313 A | 9/1990 | Cote et al. |
| 4,962,423 A | 10/1990 | Yamada et al. |
| 4,968,381 A | 11/1990 | Prigge et al. |
| 4,986,878 A | 1/1991 | Malazgirt et al. |
| 5,032,203 A | 7/1991 | Doy et al. |
| 5,057,462 A | 10/1991 | Eisenberg et al. |
| 5,064,683 A | 11/1991 | Poon et al. |
| 5,084,419 A | 1/1992 | Sakao |
| 5,209,816 A | 5/1993 | Yu et al. |
| 5,262,354 A | 11/1993 | Cote et al. |
| 5,273,558 A | 12/1993 | Nelson et al. |
| 5,288,333 A | 2/1994 | Tanaka et al. |
| 5,294,570 A | 3/1994 | Fleming, Jr. et al. ....... 438/800 |
| 5,312,777 A | 5/1994 | Cronin et al. |
| 5,320,706 A | 6/1994 | Blackwell |
| 5,320,978 A | 6/1994 | Hsu |
| 5,340,370 A | 8/1994 | Cadien et al. |
| 5,346,584 A | 9/1994 | Nasr et al. |
| 5,362,668 A | 11/1994 | Tasaka |
| 5,362,669 A | 11/1994 | Boyd et al. |
| 5,363,550 A | 11/1994 | Aitken et al. |
| 5,376,482 A | 12/1994 | Hwang et al. |
| 5,389,194 A | 2/1995 | Rostoker et al. |
| 5,389,579 A | 2/1995 | Wells |
| 5,392,361 A | 2/1995 | Imaizumi et al. |
| 5,395,801 A | 3/1995 | Doan et al. |
| 5,397,741 A | 3/1995 | O'Connor et al. |
| 5,401,691 A | 3/1995 | Caldwell |
| 5,406,111 A | 4/1995 | Sun |
| 5,421,769 A | 6/1995 | Schultz et al. ............... 451/287 |
| 5,435,772 A | 7/1995 | Yu |
| 5,436,488 A | 7/1995 | Poon et al. |
| 5,441,094 A | 8/1995 | Pasch |
| 5,453,639 A | 9/1995 | Cronin et al. |
| 5,459,096 A | 10/1995 | Venkatesan et al. |
| 5,468,983 A | 11/1995 | Hirase et al. |
| 5,486,265 A | 1/1996 | Salugsugan |
| 5,492,858 A | 2/1996 | Bose et al. |
| 5,494,857 A | 2/1996 | Cooperman et al. |
| 5,503,962 A | 4/1996 | Caldwell |
| 5,525,840 A | 6/1996 | Tominaga |
| 5,531,861 A | 7/1996 | Yu et al. |
| 5,541,427 A | 7/1996 | Chappell et al. |
| 5,551,986 A | 9/1996 | Jain |
| 5,573,633 A | 11/1996 | Gambino et al. |
| 5,578,523 A | 11/1996 | Fiordalice et al. |
| 5,591,239 A | 1/1997 | Larson et al. |
| 5,595,937 A | 1/1997 | Mikagi |
| 5,602,423 A | 2/1997 | Jain ......................... 257/752 |
| 5,607,345 A | 3/1997 | Barry et al. |
| 5,616,513 A | 4/1997 | Shepard |
| 5,629,242 A | 5/1997 | Nagashima et al. |
| 5,643,406 A | 7/1997 | Shimomura et al. |
| 5,643,823 A | 7/1997 | Ho et al. |
| 5,643,836 A | 7/1997 | Meister et al. |
| 5,652,176 A | 7/1997 | Maniar et al. |
| 5,656,097 A | 8/1997 | Olesen et al. |
| 5,662,769 A | 9/1997 | Schonauer et al. ......... 438/633 |
| 5,664,990 A | 9/1997 | Adams et al. |
| 5,665,202 A | 9/1997 | Subramanian et al. |
| 5,666,985 A | 9/1997 | Smith, Jr. et al. |
| 5,676,587 A | 10/1997 | Landers et al. |
| 5,695,572 A | 12/1997 | Brunner et al. ................ 134/3 |
| 5,702,977 A | 12/1997 | Jang et al. |
| 5,721,172 A | 2/1998 | Jang et al. |
| 5,728,308 A | 3/1998 | Muroyama |
| 5,776,808 A | 7/1998 | Muller et al. |
| 5,782,675 A | 7/1998 | Southwick .................... 451/56 |
| 5,786,260 A | 7/1998 | Jang et al. .................. 438/401 |
| 5,837,612 A | 11/1998 | Ajuria et al. |
| 5,906,532 A | 5/1999 | Nakajima et al. |
| 5,919,082 A | 7/1999 | Walker et al. ................. 451/41 |
| 5,928,959 A | 7/1999 | Huckels et al. |
| 5,943,590 A | 8/1999 | Wang et al. |
| 5,952,687 A | 9/1999 | Kawakubo et al. |
| 5,958,794 A | 9/1999 | Bruxvoort et al. |
| 5,963,841 A | 10/1999 | Karlsson et al. ............ 438/952 |
| 5,972,124 A | 10/1999 | Sethuraman et al. |
| 5,972,792 A * | 10/1999 | Hudson ....................... 438/691 |
| 6,010,964 A | 1/2000 | Glass ......................... 438/692 |
| 6,016,000 A | 1/2000 | Moslehi ....................... 257/522 |
| 6,042,996 A | 3/2000 | Lin et al. ..................... 430/313 |
| 6,093,631 A * | 7/2000 | Jaso et al. ................... 438/618 |
| 6,143,663 A * | 11/2000 | Koutny ....................... 438/691 |

OTHER PUBLICATIONS

Singer, "CMP Developers Take Aim at STI Applications" and "Slurry–Free CMP Reduces Dishing, Speeds Process," *Semiconductor International*, vol. 21, No. 2, p. 40.

Ali et al., "Chemical–Mechanical Polishing of Interlayer Dielectric: A Review," *Solid State Technology*, Oct. 1994, pp. 63–68.

Sivaram et al., "Developments in Consumables Used in the Chemical Mechanical Polishing of Dieletric," *International Conference on Solid State Devices & Materials*, Aug. 1995, p. 166.

Wolf, *Silicon Processing for the VLSI Era vol. 2: Process Integration*, Lattice Press 1990, pp. 189–191.

\* cited by examiner

PLANARIZED SEMICONDUCTOR INTERCONNECT TOPOGRAPHY AND METHOD FOR POLISHING A METAL LAYER TO FORM INTERCONNECT

This is a continuation application from prior application Ser. No. 09/143,723, filed Aug. 31, 1998, which is now U.S. Pat. No. 6,232,231.

BACKGROUND OF THE INVENTION

1. Field of the Invention

This invention relates to integrated circuit manufacturing and, more particularly, to a substantially planarized interconnect topography and method for making spaced interconnect by forming a plurality of dummy features in a dielectric layer between a relatively wide interconnect structure and a series of relatively narrow interconnect structures.

2. Description of the Related Art

Fabrication of an integrated circuit involves numerous processing steps. After implant regions (e.g., source/drain regions) have been placed within a semiconductor substrate and gate areas defined upon the substrate, an interlevel dielectric is formed across the topography to isolate the gate areas and the implant regions from overlying conducting regions. Interconnect routing is then patterned across the interlevel dielectric and connected to the implant regions and/or the gate areas by ohmic contacts formed through the interlevel dielectric. Alternating levels of interlevel dielectric and interconnect may be placed across the semiconductor topography to form a multi-level integrated circuit.

As successive layers are deposited across previously patterned layers of an integrated circuit, elevational disparities develop across the surface of each layer. If left unattended, the elevational disparities in each level of an integrated circuit can lead to various problems. For example, when a dielectric, conductive, or semiconductive material is deposited over a topological surface having elevationally raised and recessed regions, step coverage problems may arise. Step coverage is defined as a measure of how well a film conforms over an underlying step and is expressed by the ratio of the minimum thickness of a film as it crosses a step to the nominal thickness of the film over horizontal regions. Also, stringers may arise from incomplete etching over severe steps. Furthermore, correctly patterning layers upon a topological surface containing fluctuations in elevation may be difficult using optical lithography. The depth-of-focus of the lithography alignment system may vary depending upon whether the resist resides in an elevational "hill" or "valley" area. The presence of such elevational disparities therefore makes it difficult to print high resolution features.

Techniques involving chemical and mechanical abrasion (e.g., chemical-mechanical polishing) to planarize or remove the surface irregularities have grown in popularity. As shown in FIG. 1, a typical chemical-mechanical polishing ("CMP") process involves placing a semiconductor wafer 12 face-down on a polishing pad 14 which lies on or is attached to a rotatable table or platen 16. A popular polishing pad medium comprises polyurethane or polyurethane-impregnated polyester felts. During the CMP process, polishing pad 14 and semiconductor wafer 12 may be rotated while a carrier 10 holding wafer 12 applies a downward force F upon polishing pad 14. An abrasive, fluid-based chemical suspension, often referred to as a "slurry", is deposited from a conduit 18 positioned above pad 14 onto the surface of polishing pad 14. The slurry may fill the space between pad 14 and the surface of wafer 12. The polishing process may involve a chemical in the slurry reacting with the surface material being polished. The rotational movement of polishing pad 14 relative to wafer 12 causes abrasive particles entrained within the slurry to physically strip the reacted surface material from wafer 12. The pad 14 itself may also physically remove some material from the surface of the wafer 12. The abrasive slurry particles are typically composed of silica, alumina, or ceria.

CMP is commonly used to form a planarized level of an integrated circuit containing interconnect laterally spaced from each other in what is generally referred to as the "damascene" process. Laterally spaced trenches are first etched in an interlevel dielectric configured upon a semiconductor topography comprising electrically conductive features. A conductive material is then deposited into the trenches and on the interlevel dielectric between trenches to a level spaced above the upper surface of the interlevel dielectric. CMP is applied to the surface of the conductive material to remove that surface to a level substantially commensurate with that of the upper surface of the interlevel dielectric. In this manner, interconnect that are isolated from each other by the interlevel dielectric are formed exclusively in the trenches. CMP can planarize only localized regions of the interconnect surface such that all interconnect traces have a co-planar upper surface, provided certain conditions are met. The localized area must contain trenches that are consistently, and closely spaced from each other. Moreover the trenches must be relatively narrow in lateral dimension. If those rather restrictive requirements are not met, then thicknesses of a given interconnect layer can vary to such a degree that local regions of interconnect may suffer severe current carrying limitations.

In particular, planarization may become quite difficult in a region where there is a relatively large distance between a series of relatively narrow interconnect, or if there is a relatively wide interconnect such as that found in, for example, a bond pad. FIGS. 2–4 illustrate a typical damascene process and the localized thinning or "dishing" problem experienced by conventional metal CMP processes.

As shown in FIG. 2, a series of relatively narrow trenches 22 and a relatively wide trench 24 are formed in an interlevel dielectric 20 using well-known lithography and etch techniques. The series of narrow trenches 22 and the wide trench 24 are laterally separated by a region of interlevel dielectric having a smooth upper surface 26. FIG. 3 illustrates a conductive material 28, e.g., a metal, such as Al, W, Ta, and Ti, deposited across the topography to a level spaced above upper surface 26. Due to the conformal nature of the sputter or CVD process used to apply the conductive material, the conductive material takes on an upper surface topography having a first region 30 formed over closely spaced hill and valley areas spaced above the series of narrow trenches 22. The topography also includes a second region 32 having a single wide valley area spaced above the wide trench 24 and a substantially flat third region 34 spaced above smooth upper surface 26. Conductive material 28 is then polished, as shown in FIG. 4, using CMP to remove conductive material 28 from the upper surface of interlevel dielectric 20. As a result of CMP, a series of relatively narrow interconnect 36 are formed exclusively in narrow trenches 22 and a relatively wide interconnect 38 is formed exclusively in wide trench 24. The narrow interconnect 36 may serve to electrically connect underlying active devices and conductive elements of the semiconductor topography. The wide interconnect 38 may subsequently function as, e.g., a bond pad.

Unfortunately, the topological surface of the interconnect level is not absent of elevational disparity. That is, the upper surface of interconnect 38 includes a recessed area 42 that extends below a substantially planar upper surface 44 of interlevel dielectric 20. Recessed area 42 may result from a phenomena known as the "dishing" effect. Dishing naturally results from the polishing pad flexing or conforming to the surface being polished. If the surface being polished is initially bowed or arcuate (i.e., is not planar), the polishing pad will take on the shape of the non-planar regions causing further dishing of the surface being polished. The CMP slurry initiates the polishing process by chemically reacting with the surface material in both elevated and recessed areas. Because of the deformation of the CMP pad, the reacted surface material in recessed areas may be physically stripped in addition to the reacted surface material in elevated areas. As such, a surface having fluctuations in elevation may continue to have some elevational disparity even after it has been subjected to CMP. The dishing effect is particularly a problem when forming a relatively wide interconnect between regions of a dielectric that is substantially more dense than the metal. While the dielectric is hard enough to support the overlying regions of the CMP pad, the metal is not, and thus allows significant flexing of the pad. Such flexing of the CMP pad causes the surface of the metal interconnect to become recessed relative to adjacent regions of the dielectric.

In addition, the topological surface includes a recessed area 40 arranged over the set of narrow interconnect 36. It is believed that such a recessed area 40 forms due to so-called "oxide erosion" of interlevel dielectric 20, assuming that the dielectric is composed of silicon oxide. The CMP slurry chosen to polish the metal of the interconnect includes a chemical component that reacts with metal at a faster rate than with oxide. As such, even after the metal surface has been removed to a level commensurate with that of the oxide surface, its removal may continue at a faster rate than that of the oxide. The metal surface thus becomes spaced below that of the oxide, creating steps in the topological surface. At this point, the relatively small, elevated oxide regions are removed by the CMP pad at a faster rate than large area oxide regions, or even the adjacent, recessed metal regions. Because the oxide outside the area comprising the densely packed interconnect has no elevational disparity, its removal rate is relatively slow. Therefore, the oxide in the dense interconnect area becomes recessed below the oxide outside the dense interconnect area.

It would therefore be desirable to develop a polishing process which can achieve global planarization across the entire topological surface of an interconnect level. Global planarization requires that the polish rate be uniform in all elevated areas of the topography. Such uniformity of the polish rate is particularly needed when polishing a topography having a set of interconnect which is of relatively narrow lateral dimension spaced from a relatively wide interconnect. Herein, narrow and wide refer to a lateral dimension which extends along the trench base perpendicular and co-planar with the elongated axis of the interconnect. That is, the dielectric in the space between the series of narrow interconnect and the wide interconnect needs to be polished as quickly as the interconnect are polished in order to assure both densely spaced narrow interconnects and sparsely spaced wide interconnects have a flat and relatively co-planar upper surface. The desirous polishing process must avoid problems typically arising during CMP, for example, metal dishing or oxide erosion.

SUMMARY OF THE INVENTION

The problems outlined above are in large part solved by an embodiment of the present invention in which a substantially planar semiconductor topography is formed by placing a plurality of dummy conductors in a dielectric layer between a region defined by a relatively wide interconnect and another region defined by a series of relatively narrow interconnect. A plurality of electrically conductive features are embodied within the topography. The dielectric layer may be placed between an interconnect level and an underlying semiconductor substrate upon and within which active devices have been formed. Alternatively, the dielectric layer may be placed between successive interconnect levels. The dielectric layer may comprise a material having a relatively low dielectric constant, e.g. glass- or silicate-based dielectric, preferably oxide.

According to an embodiment, a plurality of laterally spaced dummy trenches are first etched in the dielectric layer between a relatively wide trench and a series of relatively narrow trenches. The widths, lengths, and depths of the dummy trenches, the wide trench, and the narrow trenches may vary according to design preferences and criteria. The lateral widths of the wide trench, the dummy trenches, and the narrow trenches are preferably greater than 50 microns, 1 to 5 microns, and less than 1 micron, respectively. The depth of the wide, dummy, and narrow trenches is preferably 2,000 Å to 1 micron. The dummy trenches, the wide trench, and the narrow trenches are filled with a conductive material, e.g., a metal, such as aluminum, copper, tungsten, molybdenum, tantalum, titanium, and alloys thereof. The conductive material is deposited to a level spaced above the upper surface of the dielectric layer. The surface of the conductive material is then polished to a level substantially coplanar with that of the upper surface of the dielectric layer. Advantageously, the polish rate of the conductive material above the dummy trenches and the wide and narrow trenches is substantially uniform. In this manner, dummy conductors spaced apart by dielectric protrusions are formed exclusively in the dummy trenches, and interconnect are formed exclusively in the narrow and wide trenches. The dummy conductors are electrically separate from electrically conductive features of the ensuing integrated circuit. As such, the dummy conductors preferably serve no purpose except to improve the planarization of the interconnect level in which they reside. The dummy conductors therefore do not contain transitory voltages and/or current associated with or connected to active and passive devices within the semiconductor topography. Most likely, the dummy conductors are connected to a power supply or ground, but not to any gate inputs or source/drain outputs of a active transistors, nor are they connected to any terminals of passive resistors or capacitors.

In one embodiment, the conductive material may be polished using well-known CMP. That is, the frontside of the semiconductor topography may be forced against a CMP polishing pad while the polishing pad and the topography are rotated relative to each other. A CMP slurry entrained with abrasive particles, e.g., ceria, silica, or alumina, is dispensed upon the polishing pad surface to aid in the removal of the conductive material. In an alternate embodiment, a "fixed-abrasive" technique is used to polish the conductive material. The fixed-abrasive technique involves placing a liquid which is substantially free of particulate matter between the surface of the conductive material and an abrasive polishing surface of a polishing pad. The liquid contains no chemical constituent that could react with the topography. The abrasive polishing surface is moved relative to the semiconductor topography so as to polish the conductive material. The liquid applied to the polishing surface preferably comprises deionized water, however, other liquids which have a near-neutral pH value may alternatively be directed onto the abrasive polishing surface. The pH that is chosen for the polishing process is one suitable for the conductive material and the polishing pad. The polishing surface comprises a polymer-based matrix entrained with particles selected from the group consisting of cerium oxide, cerium dioxide, aluminum oxide, silicon dioxide, titanium oxide, chromium oxide, and zirconium oxide.

The abrasive polishing surface belongs to a polishing pad which is substantially resistant to deformation even when placed across an elevationally recessed region of relatively large lateral dimension (e.g., over 200 microns lateral dimension). Therefore, the pad is relatively non-conformal to the underlying surface and thus does not come in contact with elevationally recessed regions of the conductive material. It is believed that the particles dispersed throughout the abrasive polishing surface in combination with the polishing liquid interact chemically and physically with the elevated regions of the conductive material to remove those regions. However, the liquid alone may be incapable of removing the conductive material in elevationally recessed regions. As such, elevationally raised regions of the conductive material are removed at a substantially faster rate than elevationally recessed regions. The polish rate slows down significantly as the topological surface of the interconnect level approaches planarity.

Whatever polishing technique is applied to the conductive material, the presence of the plurality of dummy conductors between the series of relatively narrow interconnect and the relatively wide interconnect provides for global planarization of the topography employing the trenches. In particular, the dummy conductors and the interposing dielectric protrusions replace a relatively wide dielectric region absent of any conductive material. It is theorized that the metal of the dummy conductors, being softer than the dielectric, contracts when a polishing pad is forced against it. Consequently, the surface of the polishing pad extending over the dummy conductors and the wide interconnect during polishing remains substantially flat when pressure is applied thereto. That is, the surface area of the dielectric protrusions between the dummy conductors is not sufficient to withstand the force of the polishing pad, and thus does not cause the pad to flex. Therefore, dishing of the conductive material in the wide trench is less likely to occur as a result of the polishing process.

Also, the dummy conductors help prevent surface disparity that could result from erosion of the dielectric layer. The conductive material may continue to be polished more rapidly than the dielectric once the surface of the conductive material has been removed to the same elevational plane as the dielectric. The dielectric protrusions between the dummy conductors and the closely spaced narrow interconnect may thus become elevated above the conductive material. Consequently, the entire topological surface of the interconnect level has surface disparities, causing the polish rate of the elevated dielectric protrusions to become greater than that of the recessed dummy conductors and interconnect. As the polishing process continues, the dielectric protrusions are again made substantially coplanar with the dummy conductors and the interconnect. This cycle may be repeated until it is desirable to stop the polishing process.

BRIEF DESCRIPTION OF THE DRAWINGS

Other objects and advantages of the invention will become apparent upon reading the following detailed description and upon reference to the accompanying drawings in which.

Figure 1:
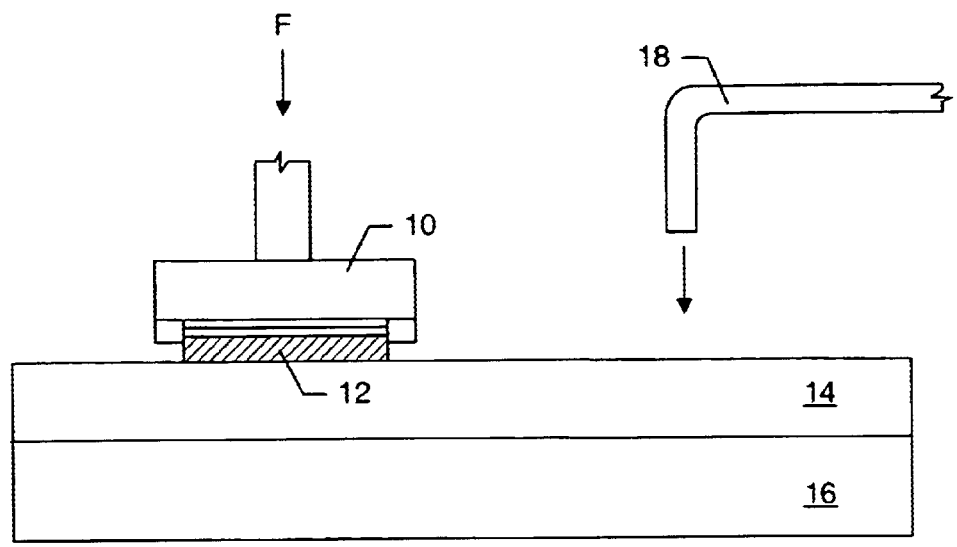
FIG. 1 depicts a side plan view of an apparatus that may be used to chemical-mechanical polish a semiconductor topography.
Figure 2:
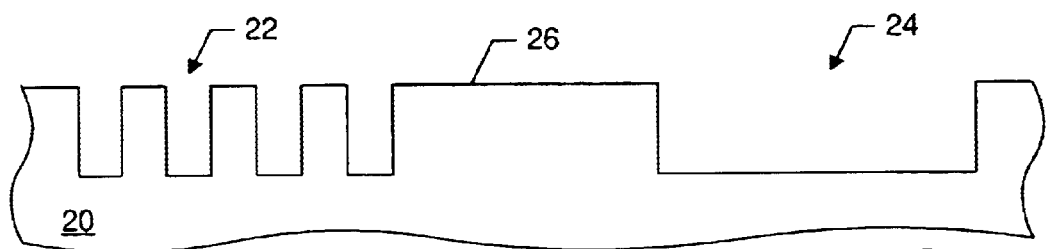
FIG. 2 depicts a partial cross-sectional view of a conventional semiconductor topography, wherein a series of relatively narrow trenches are formed within an interlevel dielectric a spaced distance from a relatively wide trench.
Figure 3:
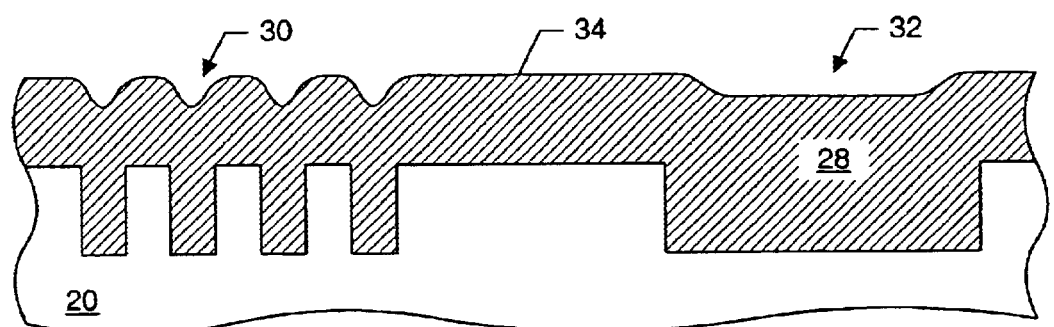
FIG. 3 depicts a partial cross-sectional view of the semiconductor topography, wherein a conductive material is deposited into the trenches to a level spaced above an upper surface of the interlevel dielectric.
Figure 4:
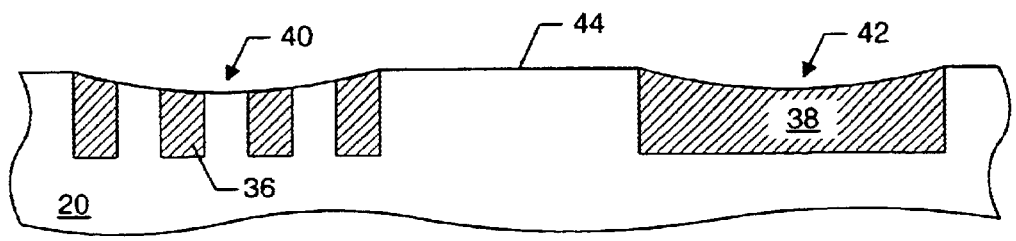
FIG. 4 depicts a partial cross-sectional view of the semiconductor topography, wherein the surface of the conductive material is removed from the upper surface of the interlevel dielectric using a conventional CMP technique, thereby forming a topological surface having elevational disparities.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 5:
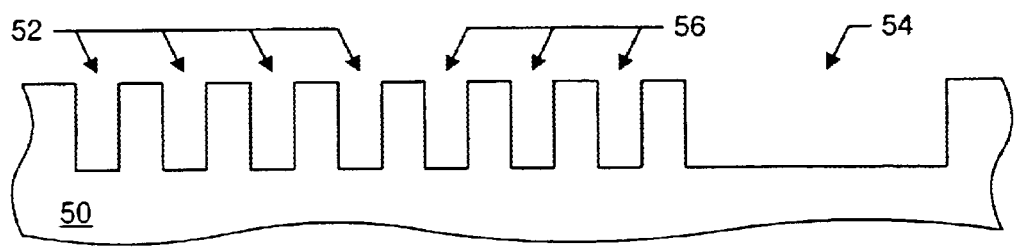
FIG. 5 depicts a partial cross-sectional view of a semiconductor topography according to an embodiment of the present invention, wherein a plurality of laterally spaced dummy trenches are formed in a dielectric layer between a relatively wide trench and a series of relatively narrow trenches.

Turning to FIG. 5, a partial cross-section of a semiconductor topography is presented. Electrically conductive features may be embodied within the topography. A dielectric layer 50 is shown which may comprise a dielectric material having a relatively low dielectric constant. Dielectric layer 50 may comprise, e.g., a glass- or silicate-based material, such as an oxide that has been deposited by chemical-vapor deposition ("CVD") from either a tetraethyl orthosilicate ("TEOS") source or a silane source and doped with an impurity, e.g., boron or phosphorus. Dielectric layer 50 may serve as a poly-metal interlevel dielectric ("PMD") between a doped polycrystalline silicon ("polysilicon") gate layer and an ensuing metal interconnect layer. It is to be understood that the gate layer may comprise other conductive materials besides polysilicon. Alternatively, dielectric 50 may form an inter-metal interlevel dielectric ("IMD") between an underlying metal interconnect layer and an ensuing overlying metal interconnect layer.

A plurality of dummy trenches 56 may be formed in dielectric layer 50 between a series of relatively narrow trenches 52 and a relatively wide trench 54. While the dimensions of these trenches may vary depending on the design specifications, the dummy trenches 56 are preferably 1 to 5 microns in width, the narrow trenches 52 preferably have sub-micron widths, and the wide trench 54 is preferably greater than 50 microns in width. Also, the depths of all the trenches may range from 2,000 Å to 1 micron. Further, the set of relatively narrow trenches 52 may be spaced apart by a distance of less than 1 micron and from the relatively wide trench 54 by a distance greater than 50 microns. Although the spacing between dummy trenches 56 may vary, this spacing may, e.g., range from 0.5 micron to 50 micron. The trenches may be formed by lithographically patterning a photoresist layer upon dielectric layer 50 to expose select portions of the depicted dielectric. The select portion of dielectric layer 50 not covered by the patterned photoresist is then etched using an etch technique, e.g., a $CF_4$ plasma etch.

Figure 6:
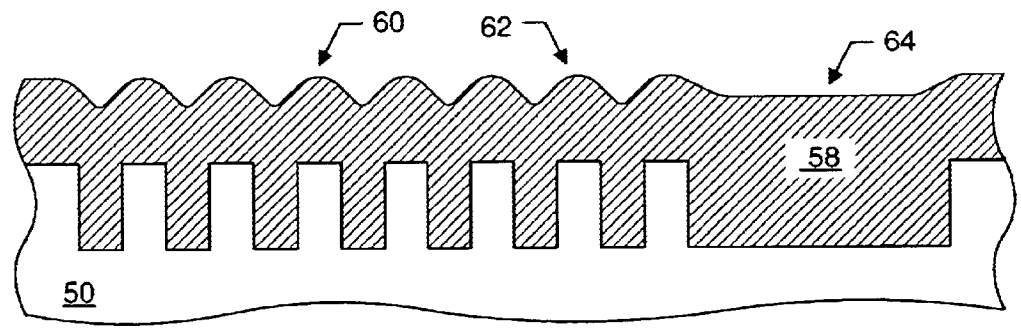
FIG. 6 is a partial cross-sectional view of the semiconductor topography, wherein a conductive material is deposited into the dummy trenches, the narrow trenches, and the wide trench to a level spaced above the upper surface of the dielectric layer.

As shown in FIG. 6, a conductive material 58 may subsequently be deposited into the trenches and across dielectric layer 50 to a level spaced above the uppermost horizontal surface of dielectric layer 50. Conductive material 58 may comprise a metal, e.g., aluminum, copper, tungsten, molybdenum, tantalum, titanium, and alloys thereof. Such a metal may be sputter deposited from a metal target or MOCVD (i.e., metal organic CVD) deposited from a metal organic source. The as-deposited conductive material 58 has an elevationally disparate surface that includes a first region 60 above narrow trenches 52, a second region 62 above dummy trenches 56, and a third region 64 above wide trench 54. The valley areas of regions 60, 62, and 64 are directly above respective trenches, while the hill areas are directly above respective dielectric protrusions that are positioned between the trenches.

Figure 7:
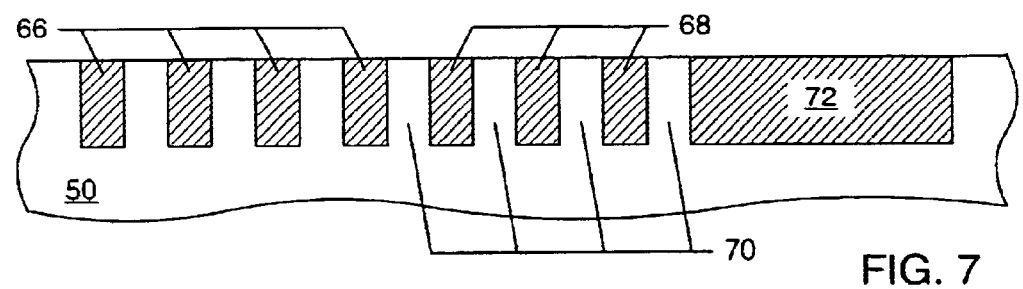
FIG. 7 is a partial cross-sectional view of the semiconductor topography, wherein the surface of the conductive material is removed to a level substantially commensurate with that of the upper surface of the dielectric layer using a planarization process according to an embodiment of the present invention, thereby forming a planarized topological surface.

Turning to FIG. 7, conductive material 58 may then be polished to a level substantially coplanar with the uppermost surface of dielectric layer 50. As a result of polishing conductive material 58, relatively narrow interconnect 66 are formed exclusively in trenches 52, dummy conductors 68 are formed in dummy trenches 56, and a relatively wide interconnect 72 is formed in trench 54. Dummy conductors 68 are laterally spaced from each other and/or from interconnect 66 and 72 by dummy dielectric protrusions 70. Placing dummy conductors 68 in the region between the series of narrow interconnect 66 and the wide interconnect 72 affords global planarization of the topological surface. That is, the polish rate is substantially uniform across the entire topological surface. Also, the polish rate of elevationally raised regions is greater than that of elevationally recessed regions. Further, a surface having elevational disparity is polished at a faster rate than a substantially flat surface.

It is believed that the presence of dummy conductors 68 helps prevent the polishing pad from deforming about the length of the pad into relatively wide trench 54 when subjected to normal pressure. Further, it is postulated that placing dummy conductors 68 between dummy dielectric protrusions 70 ensures that elevational fluctuations are present in different regions of the topological surface at the same time. That is, no particular region of the topological surface becomes substantially planarized before other regions and thereby causes fluctuations in the polish rate across the surface. Thus, the polish rate does not slow down until the entire topological surface is substantially free of elevational disparity.

Dummy conductors 68 are not connected to any active or passive device which forms an integrated circuit of the semiconductor topography shown in FIG. 7. While dummy conductors can carry power or ground voltages, they do not carry transitory voltages or current associated with an operable circuit. Nor are they associated or connected in any way with active circuit elements and/or features such as a contact, implant, gate, etc., of a transistor, capacitor, resistor, etc.

Figure 8:
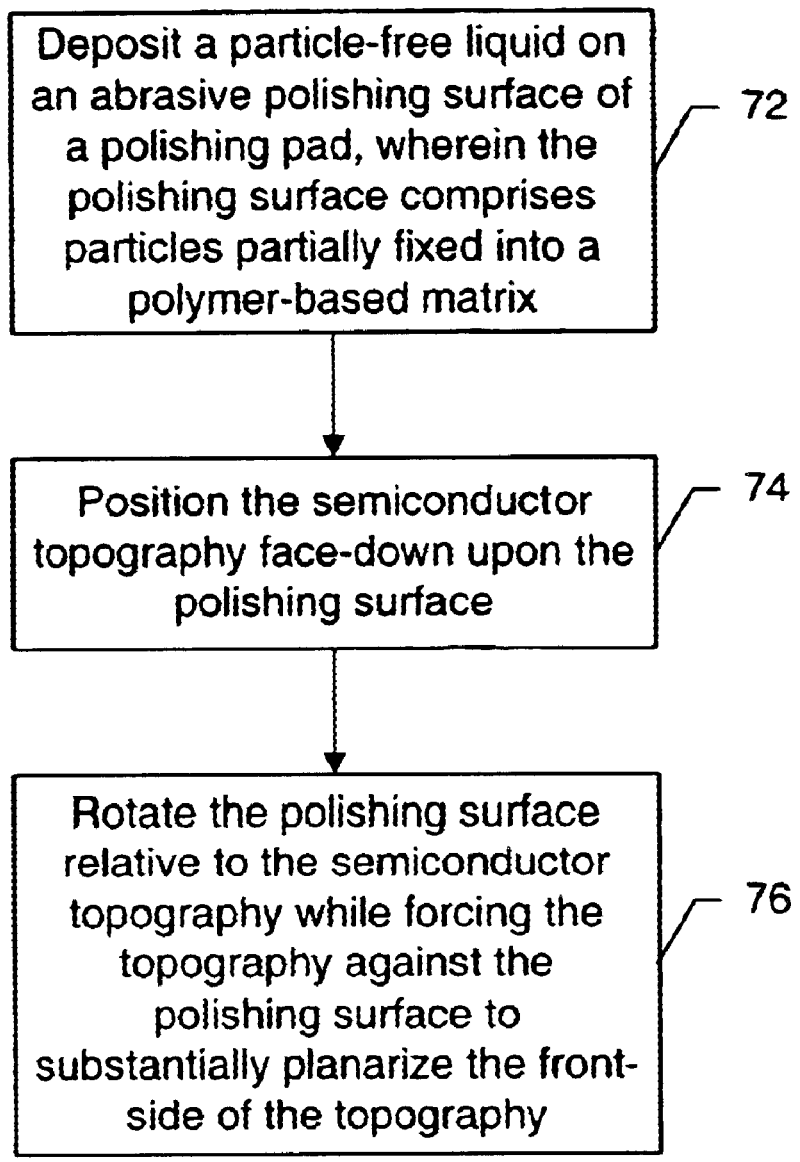
FIG. 8 is a process flow diagram of a fixed-abrasive polishing technique that may be used to polish the conductive material.

FIG. 8 illustrates a process flow diagram of a fixed abrasive CMP technique that may be used to polish conductive material 58, and thereby form the substantially planar topography shown in FIG. 7. Conductive material 58 may be polished using an apparatus similar in some respects to that shown in FIG. 1. The apparatus in FIG. 1 may be purposefully modified to accommodate an abrasive polishing surface and a conduit for delivering a particle-free solution to the polishing surface. Alternatively, a conventional CMP process may be employed for polishing conductive material 58. The CMP slurry may include a component that chemically reacts with conductive material 58.

As described in block 72, a particle-free liquid is dispensed onto an abrasive polishing surface of a polishing pad having a substantially rigid supportive backing. An appropriate polishing pad is commercially available from Minnesota Mining and Manufacturing Company. The polishing surface comprises a polymer-based matrix entrained with abrasive particles. Appropriate materials that may be used for the particles include, but are not limited to, ceria, $\alpha$ alumina, $\gamma$ alumina, silicon dioxide, titania, chromia, and zirconia. Preferably, the polishing liquid forwarded onto the abrasive polishing surface is deionized water. The polishing liquid may also be other types of liquids which have a near-neutral pH. As shown in block 74 of FIG. 8, the semiconductor topography depicted in FIG. 6 may be positioned face-down upon the polishing surface. The polishing liquid is positioned at the interface between the semiconductor topography and the abrasive polishing surface.

As indicated by block 76 of FIG. 8, the semiconductor topography and the abrasive polishing surface may be rotated relative to each other while the frontside of the topography is forced against the polishing surface. It is believed that contact between the high elevation regions of conductive material 58 and the abrasive particles as well as the polishing liquid causes the surface material of conductive material 58 in those elevated regions to be released from bondage with the bulk of the conductive material. The particles extending from the abrasive polishing surface have a sufficient hardness to dislodge the reacted surface material during abrasion of the high elevation regions. The rigidness of the polishing pad may be sufficient to prevent the abrasive polishing surface from contacting recessed regions of conductive material 58. Accordingly, very little of the conductive material 58 in the recessed regions is removed.

It will be appreciated to those skilled in the art having the benefit of this disclosure that this invention is believed to provide a method for forming a substantially planar semiconductor topography by placing a plurality of dummy conductors in a dielectric layer laterally between a relatively wide interconnect and a series of relatively narrow interconnect. Further modifications and alternative embodiments of various aspects of the invention will be apparent to those skilled in the art in view of this description. For example, electrically conductive features isolated from each other by a dielectric may subsequently be formed upon the planarized semiconductor topography. It is intended that the following claims be interpreted to embrace all such modifications and changes and, accordingly, the specification and drawings are to be regarded in an illustrative rather than a restrictive sense.

What is claimed is:

1. A method, comprising:
    etching a plurality of laterally spaced dummy trenches into a dielectric layer between a first trench and a series of second trenches, wherein each of the second trenches is relatively narrow compared to the first trench;
    filling said trenches with a conductive material; and
    polishing said conductive material to form dummy conductors in said laterally spaced dummy trenches and interconnect in said series of second trenches and said first trench, wherein said polishing comprises applying a liquid substantaily free of particulate matter between an abrasive polishing surface and the conductive material.

2. The method of claim 1, wherein said conductive material comprises a metal selected from the group consisting of aluminum, copper, tungsten, molybdenum, tantalum, titanium, and alloys thereof.

3. The method of claim 1, wherein said polishing said conductive material is performed at a substantially uniform polish rate above said laterally spaced dummy trenches and said series of relatively narrow second trenches and said first trench.

4. The method of claim 1, wherein said polishing results in dummy dielectric protrusions between adjacent pairs of said laterally spaced dummy trenches, said dummy dielectric protrusions having first upper surfaces substantially coplanar with second upper surfaces of said dummy conductors.

5. The method of claim 1, wherein said abrasive polishing surface comprises particles at least partially fixed into a polymer-based matrix, and wherein said particles comprise a material selected from the group consisting of cerium oxide, cerium dioxide, aluminum oxide, silicon dioxide, titanium oxide, chromium oxide, and zirconium oxide.

6. The method of claim 1, wherein said polishing comprises placing a CMP slurry onto a polishing pad surface, and contacting said polishing pad surface with an upper surface of said conductive material while rotating said polishing pad surface relative to said upper surface.

7. The method of claim 1, wherein said dummy conducts are substantially co-planar with said interconnect.

8. The method of claim 1, wherein said polishing comprising applying a liquid consisting essentially of deionized water at a substantially neutral pH.

9. A method comprising:
    etching a plurality of laterally spaced dummy trenches into a dielectric layer between a trench which is to receive a first interconnect feature and a series of trenches which are to receive a series of second interconnect features, wherein the first interconnect feature is relatively wide compared to each of the series of second interconnect features:
    filling said plurality of laterally spaced dummy trenches with a conductive material; and
    polishing said conductive material to form dummy conductors, wherein said polishing comprises applying a liquid substantially free of particulate matter between an abrasive polishing surface and the conductive material.

10. The method of claim 9, wherein said conductive material comprises a metal selected from the group consisting of aluminum, copper, tungsten, molybdenum, tantalum, titanium, and alloys thereof.

11. The method of claim 9, wherein said polishing said conductive material is performed at a substantially uniform polish rate above said laterally spaced dummy trenches and said trench and said series of trenches.

12. The method of claim 9, wherein said polishing results in dummy dielectric protrusion between adjacent pairs of said laterally spaced dummy trenches, said dummy dielectric protrusions having first upper surfaces substantially coplanar with second upper surfaces of said dummy conducts.

13. The method of claim 9, wherein said abrasive polishing surface comprises particles at least partially fixed into a polymer-based matrix, and wherein said particles comprise a material selected from the group consisting of cerium oxide, cerium dioxide, aluminum oxide, silicon dioxide, titanium oxide, chromium oxide, and zirconium oxide.

14. The method of claim 9, wherein said dummy conductors are substantially co-planar with said first interconnect feature and said series of second interconnect features.

15. The method of claim 9, wherein said polishing comprising applying a liquid consisting essentially of deionized water at a substantially neutral pH.

16. A substantially planar semiconductor topography, comprising:
    a plurality of laterally spaced dummy trenches in a dielectric layer, between a first trench and a series of second trenches, wherein each of the second trenches is relatively narrow compared to the first trench and wherein a lateral dimension of at least one of the laterally spaced dummy trenches is less than a lateral dimension of the first trench and greater than a lateral dimension of at least one of the series of second trenches;
    dummy conductors in said laterally spaced dummy trenches and electrically separate from electrically conductive features below said dummy conductors; and
    conductive lines in said series of second trenches and said first trench, wherein upper surfaces of said conductive lines are substantially coplanar with dummy conductor upper surfaces.

17. The substantially planar semiconductor topography of claim 16, further comprising dummy dielectric protrusions between adjacent pairs of said laterally spaced dummy trenches, said dummy dielectric protrusions having dummy dielectric upper surfaces substantially coplanar with said dummy conductor upper surfaces.

18. The substantially planar semiconductor topography of claim 16, wherein said dummy conducts comprise a metal selected from the group consisting of a aluminum, copper, tungsten, molybdenum, tantalum, titanium, and alloys thereof.

19. The substantially planar semiconductor topography of claim 16, wherein said conductive lines comprise a metal selected from the group consisting of aluminum, copper, tungsten, molybdenum, tantalum, titanium, and alloys thereof.

20. The substantially planar semiconductor topography of claim 16, wherein lateral dimensions of the laterally spaced dummy trenches are between approximately 1 micron and approximately 5 microns.

21. The substantially planar semiconductor topography of claim 16, wherein the lateral dimension of the first trench is greater than approximately 50 microns.

22. The substantially planar semiconductor topography of claim 16, wherein the series of the second trenches comprise sub-micron lateral dimensions.

* * * * *

UNITED STATES PATENT AND TRADEMARK OFFICE
CERTIFICATE OF CORRECTION

PATENT NO. : 6,849,946 B1  
DATED : February 1, 2005  
INVENTOR(S) : Sethuraman et al.

It is certified that error appears in the above-identified patent and that said Letters Patent is hereby corrected as shown below:

Column 9,
Line 28, delete "relatively narrow.".

Column 10,
Lines 10-11 and 48, delete "conducts" and substitute -- conductors --.

Signed and Sealed this

Third Day of January, 2006

JON W. DUDAS  
*Director of the United States Patent and Trademark Office*